United States Patent
Hsu et al.

(10) Patent No.: US 8,921,913 B1
(45) Date of Patent: Dec. 30, 2014

(54) FLOATING GATE FORMING PROCESS

(71) Applicant: United Microelectronics Corp., Hsin-Chu (TW)

(72) Inventors: Cheng-Yuan Hsu, Hsinchu (TW); Zhaobing Li, Singapore (SG); Chi Ren, Singapore (SG); Ching-Long Tsai, Taipei (TW); Wei Cheng, Singapore (SG)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/923,374

(22) Filed: Jun. 21, 2013

(51) Int. Cl.
*H01L 21/336* (2006.01)
*H01L 21/28* (2006.01)

(52) U.S. Cl.
CPC .................... *H01L 21/28273* (2013.01)
USPC ............... 257/315; 257/316; 257/E21.409; 257/E29.3; 438/593

(58) Field of Classification Search
CPC ..................... H01L 29/784; H01L 21/28273
USPC ............................. 257/255–266, 593
See application file for complete search history.

(56) References Cited

U.S. PATENT DOCUMENTS

| 6,579,761 | B1 | 6/2003 | Hsieh | |
|---|---|---|---|---|
| 2005/0245029 | A1* | 11/2005 | Choi et al. | 438/257 |
| 2009/0085093 | A1* | 4/2009 | Jeon | 257/316 |

* cited by examiner

*Primary Examiner* — Mamadou Diallo
(74) *Attorney, Agent, or Firm* — Winston Hsu; Scott Margo

(57) ABSTRACT

A floating gate forming process includes the following steps. A substrate containing active areas isolated from each other by isolation structures protruding from the substrate is provided. A first conductive material is formed to conformally cover the active areas and the isolation structure. An etch back process is performed on the first conductive material to respectively form floating gates separated from each other in the active areas.

11 Claims, 5 Drawing Sheets

FLOATING GATE FORMING PROCESS

BACKGROUND OF THE INVENTION

1. Field of the Invention

The present invention relates generally to a floating gate forming process, and more specifically to a floating gate forming process that uses an etching back process to form floating gates.

2. Description of the Prior Art

Microprocessor systems are able to handle data and arrange information and have become an important asset in information development of the highly developed modern information society. One of the most important structures in each kind of microprocessor system is the memory used to store digital data and to provide stored data for microprocessor systems. A flash memory or an EEPROM (electrically erasable programmable read only memory), thanks to electron operation, is able to store data in a non-volatile way and to read the stored data quickly and efficiently, unlike optical or magnetic storage media (such as discs or optical discs). Therefore, flash memories with light volumes and convenient and efficient operations have been utilized widely in various microprocessor systems, such as application chip systems, mobile phones, personal digital assistants, personal computers, digital cameras, etc.

A flash memory consists of MOS transistors with a floating gate, each serving as a memory cell for recording a bit data. A typical memory transistor in addition to a body, a drain, a source, and a control gate as well as a typical MOS transistor, has a floating gate. The floating gate is located in an oxide layer, isolated from the body, the drain, the source, and the control gate. When storing data, proper bias voltages are required to be applied to the gate, the source, the drain, and the body so that the electrons can pass through the oxide layer and thus flow into the floating gate. A different amount of charges injected into the floating gate of the transistor corresponds to different data. For instance, if more charges are injected into the floating gate, the transistor stores a data bit "1"; on the contrary, if less charges are injected into the floating gate, the transistor stores a data bit "0". The amount of charges injected into the floating gate will influence the threshold voltage of the transistor. The more negative charges are injected into the floating gate of the transistor, the smaller the absolute value of the threshold voltage of the transistor is. Under the circumstance of keeping the control voltage applied on the control gate, the more negative charge within the floating gate is, the higher the conduct performance associated with the transistor is, so that the current between the source and drain of the transistor is greater. In other words, under the circumstance of keeping the control voltage applied on the control gate, the data bit stored in the transistor depends on the amount of conduct current in the transistor between its source and drain. While overwriting or erasing the original data stored in the memory transistor, the control gate, the body, the drain, and the source are still required to have proper bias voltages applied, causing the electrons within the floating gate to pass through the oxide layer and flow into other electrodes of the transistor.

SUMMARY OF THE INVENTION

The present invention provides a floating gate forming process, which forms floating gates through an etching back process so as to control the operating windows of these floating gates.

The present invention provides a floating gate forming process including the following steps. A substrate containing active areas isolated from each other by isolation structures protruding from the substrate is provided. A first conductive material is formed to conformally cover the active areas and the isolation structures. An etch back process is performed on the first conductive material to respectively form floating gates separated from each other in the active areas.

The present invention provides a floating gate forming process including the following steps. A substrate containing active areas isolated from each other by isolation structures is provided. A first conductive material conformally covers the active areas and the isolation structures, wherein the first conductive material has voids. A pre-etch back process is performed on the first conductive material to expose the voids. The first conductive material is covered again to fill the voids. An etch back process is performed on the first conductive material to respectively form floating gates separated from each other in the active areas.

According to the above, the present invention provides a floating gate forming process, which performs an etch back process to etch a first conductive material to form floating gates between isolation structures and separated from etch other. Thus, a loading effect caused by other methods of the prior art, such as chemical mechanical polishing processes, can be avoided. Floating gates having flat top surfaces can therefore be formed, wherein the uniformity of the floating gates can be enhanced, the processing costs for forming the floating gates can be reduced and the unnecessary parts of the first conductive material left in some specific areas can be avoided. Hence, the performances of a formed semiconductor component, such as a flash memory, are enhanced when formed with the floating gates of the present invention.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
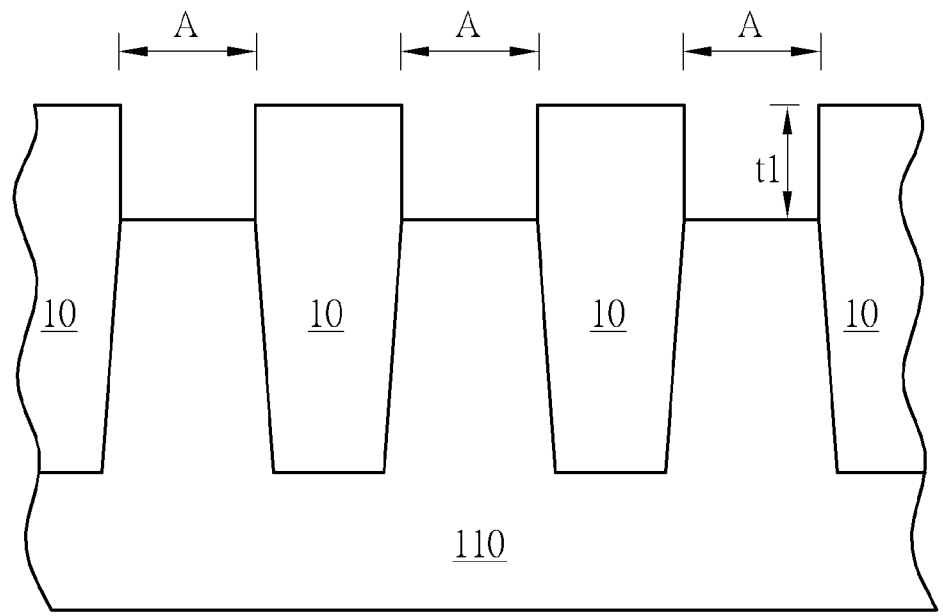
FIGS. 1-7 schematically depict cross-sectional views of a floating gate forming process according to an embodiment of the present invention.

FIGS. 1-7 schematically depict cross-sectional views of a floating gate forming process according to an embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate, a silicon-on-insulator (SOI) substrate or a substrate containing epitaxial layers such as a P-type substrate having a P-type epitaxial layer with a thickness of 2.5 micrometers. Isolation structures 10 are formed in the substrate 110, wherein the isolation structures 10 may be shallow trench isolation (STI) structures formed by a shallow trench isolation (STI) process, but it is not limited thereto. In a preferred embodiment, the isolation structures 10 protrude from the substrate 110 to isolate and separate later formed floating gates from each other, but it is not limited thereto. Thus, the substrate 110 contains active areas A isolated from each other by the isolation structures 10. Still preferably, the isolation structures 10 protrude with a thickness t1 of a range of 400~800 Angstroms from the substrate 110. Therefore, the thickness t1 is large enough to isolate and separate later formed floating gates without affecting components being formed thereon, thereby reducing the processing costs and the processing time as much as possible while enhancing the performances of the components.

Figure 2:
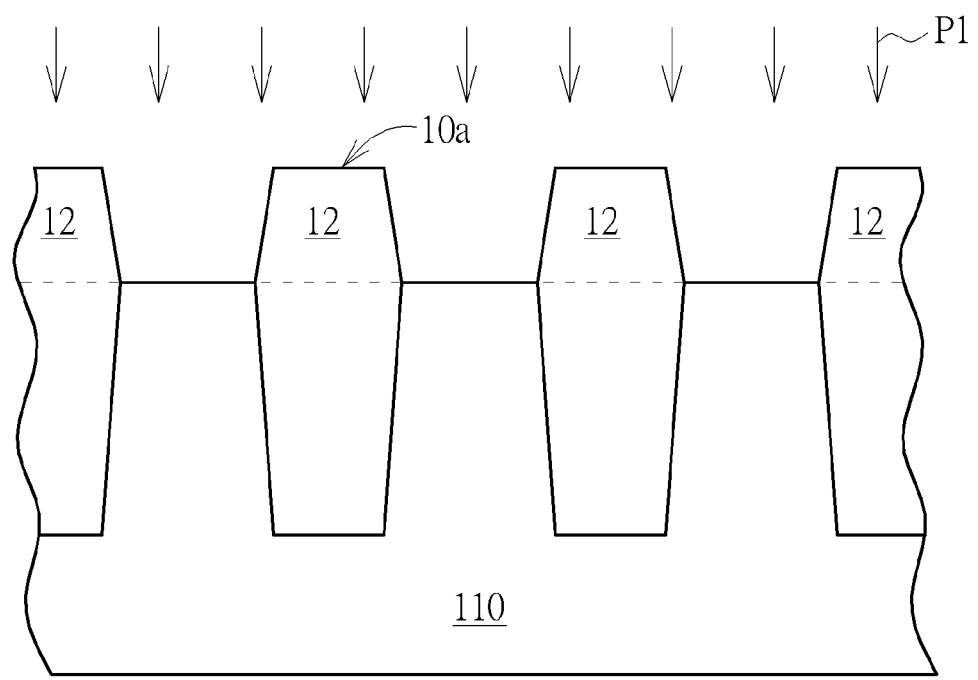

As shown in FIG. 2, a shaping process P1 is performed to shape the isolation structures 10 and therefore form isolation structures 10a, wherein the isolation structures 10a have an upper part 12 protruding from the substrate 110, and the upper part 12 preferably has a taper profile broadening from top to bottom, so that a later formed first conductive material between the isolation structures 10a can be filled easily without generating voids therein, thereby improving the performances of a formed floating gate. However, the profile of the isolation structures 10a is not limited thereto, depending upon the needs, the kind of process and the parameters of the shaping process P1 can vary according to the desired formed profile of the isolation structures 10a. In one embodiment, the shaping process P1 is an etching process, but not limited to. In this embodiment, the isolation structures 10a are formed after the isolation structures 10 are formed. In addition, the isolation structures 10a may be formed directly without forming the isolation structures 10 first.

Figure 3:
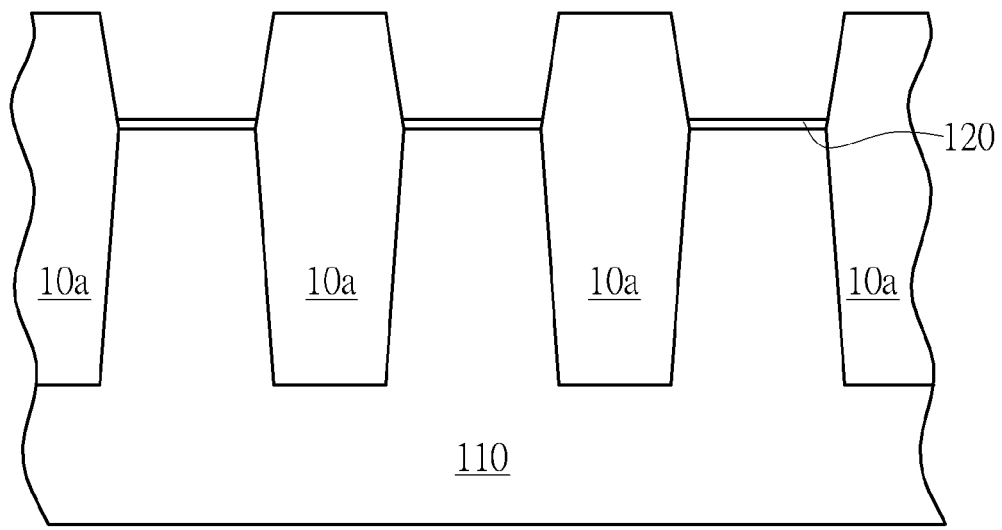

As shown in FIG. 3, a second isolating layer 120 may be formed on the substrate 110 between the isolation structures 10. The second isolating layer 120 may be an oxide layer, which may be formed by a thermal oxide process or a chemical oxide process etc. In this embodiment, the second isolating layer 120 serves as a tunnel oxide of a formed semiconductor structure such as a flash memory, but it is not limited thereto.

Figure 4:
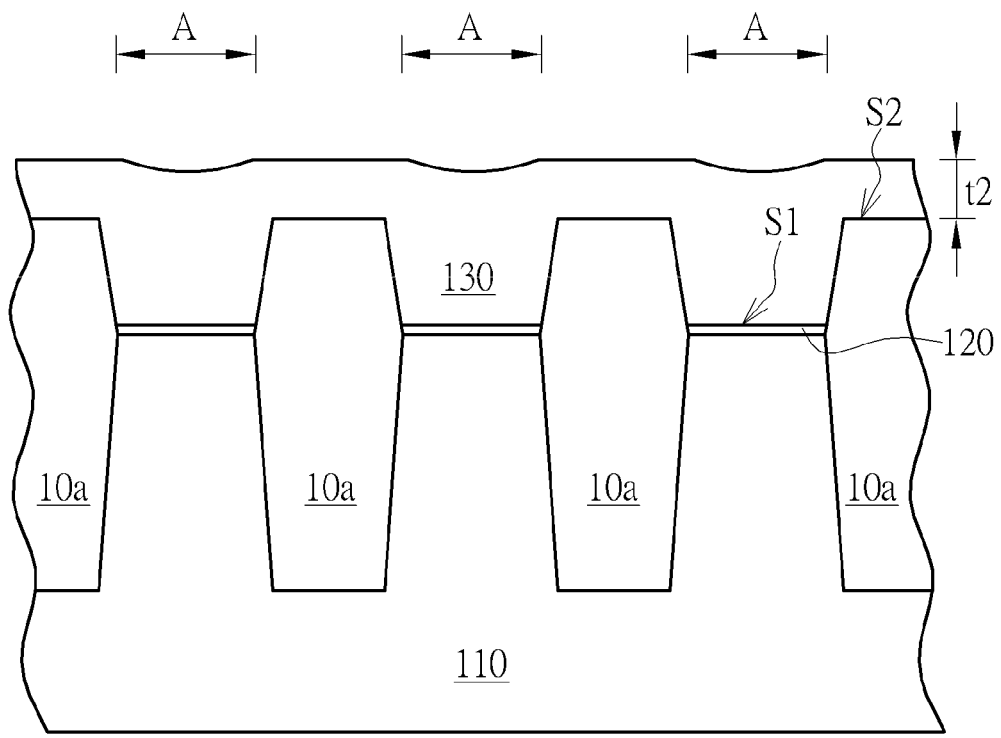

As shown in FIG. 4, a first conductive material 130 is formed to conformally cover the active areas A and the isolation structures 10a. The first conductive material 130 may be composed of polysilicon, but it is not limited thereto. Preferably, the first conductive material 130 is formed until a thickness t2 of the part protruding from the isolation structures 10a is larger than 500 Angstroms. Thus, the divots of the first conductive material 130 formed on the active areas A and the isolation structures 10a have different top surfaces S1 and S2 levels, which can be planarized by a later performed etch back process, but not limited thereto.

Figure 8:
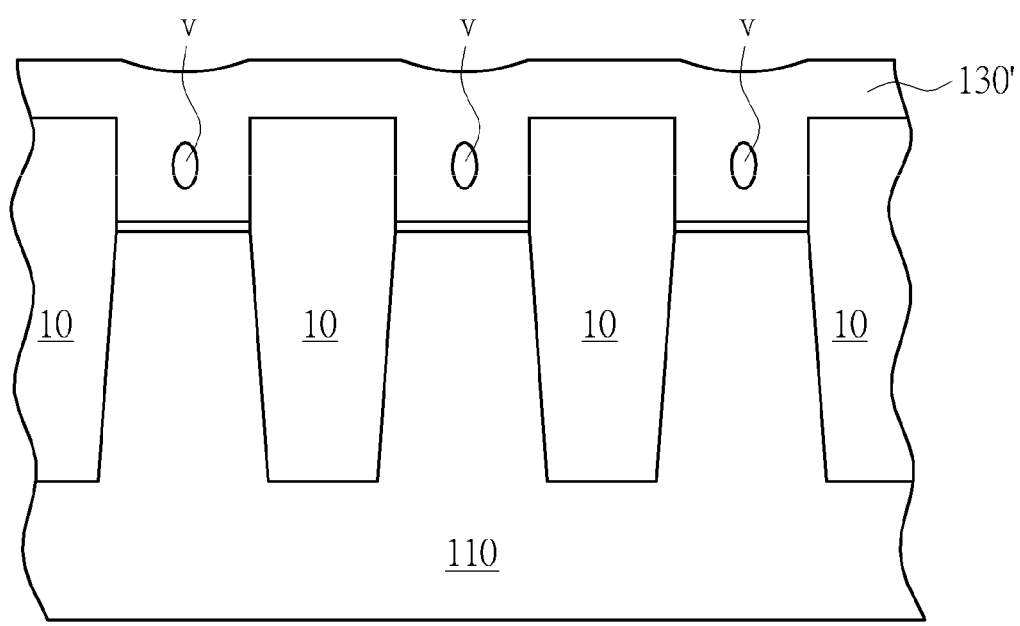
FIGS. 8-10 schematically depict cross-sectional views of a floating gate forming process according to another embodiment of the present invention.
Figure 9:
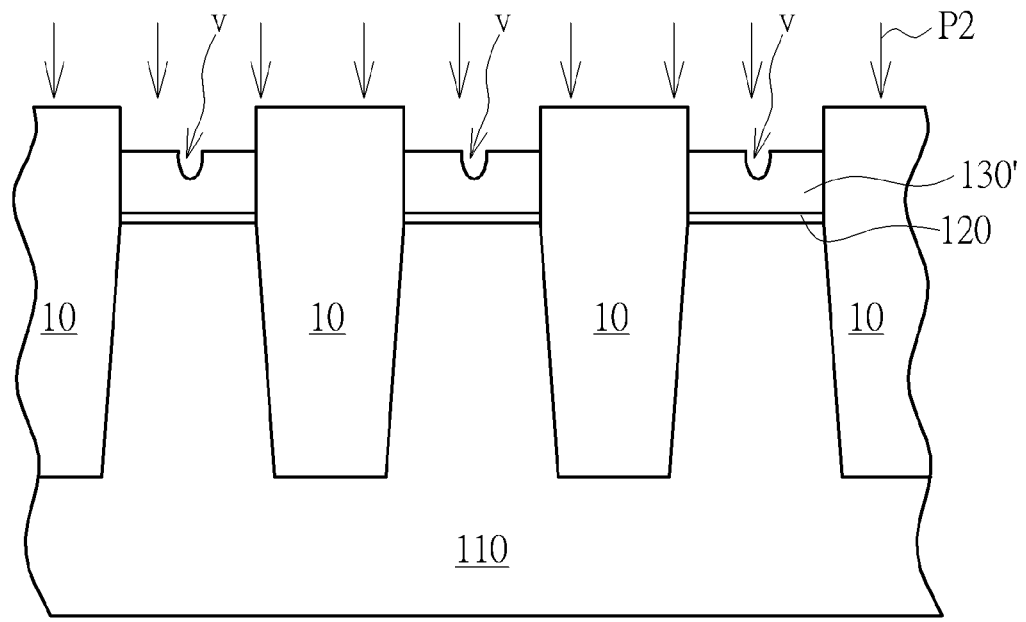
Figure 10:
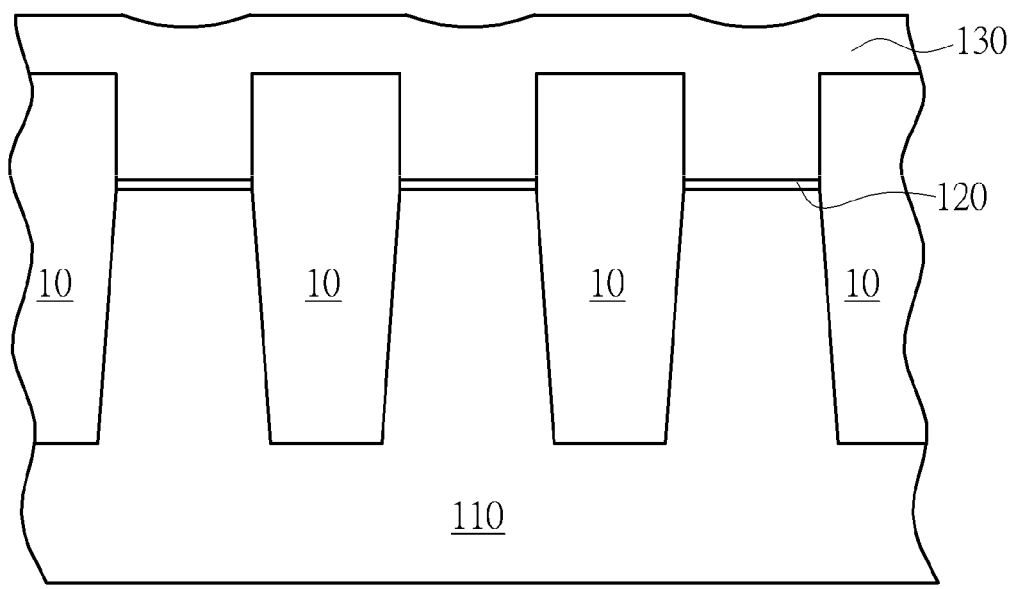

According to the previous steps of this embodiment shown in FIGS. 1-4, the isolation structures 10a having an upper part 12 with a taper profile broadening from top to bottom are formed, so that the first conductive material 130 formed between the isolation structures 10a can be formed without voids generated therein. In another embodiment, as shown in FIGS. 8-10, which schematically depict cross-sectional views of a floating gate forming process according to another embodiment of the present invention, the isolation structures 10 may be formed without further performing the shaping process P1 of FIG. 2. Therefore, the first conductive material 130' formed between the isolation structures 10 would have voids therein as shown in FIG. 8. Thus, a pre-etch back process P2 is performed on the first conductive material 130' to expose the voids V as shown in FIG. 9. The pre-etch back process P2 may be a dry etch process or/and a wet etch process. Thus, thanks to the pre-etch back process P2, the loading effect caused by other methods, such as chemical mechanical polishing processes, can be avoided. Then, the first conductive material 130' is covered again to fill the voids V, and so is formed the first conductive material 130 without voids V therein. Also preferably, the first conductive material 130 is formed until a thickness protruding from the isolation structures 10 larger than 500 Angstroms is achieved. Thus, the divots of the first conductive material 130 formed on the active areas A and the isolation structures 10 having different top surfaces levels can be removed by a later performed etched back process but not limited thereto.

In still another embodiment, the pre-etch back process P2 of FIG. 9 may be performed after the isolation structures 10a having the upper part 12 with a taper profile are formed for further preventing voids from being generated in the first conductive material 130.

Figure 5:
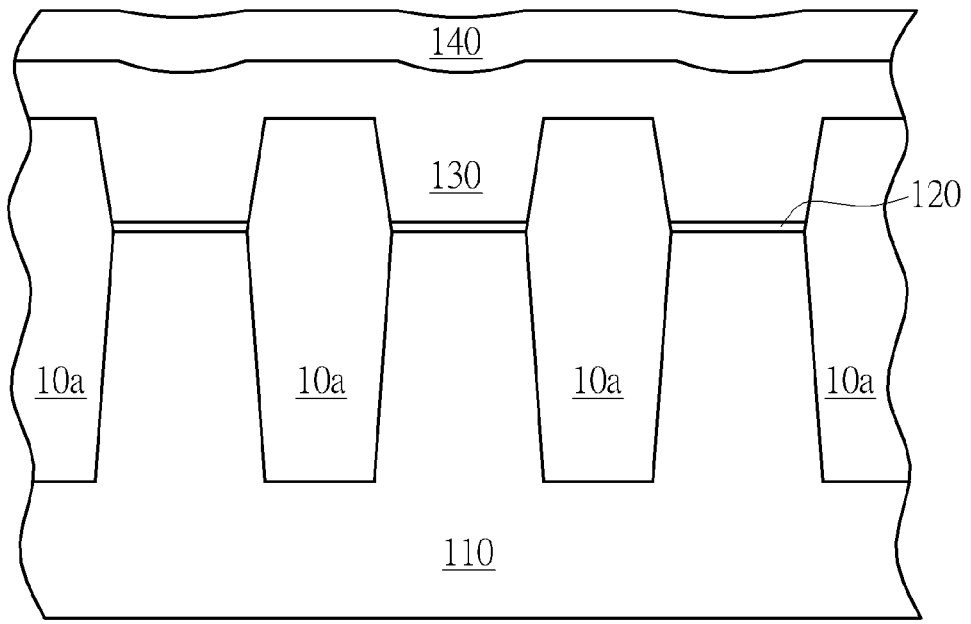
Figure 6:
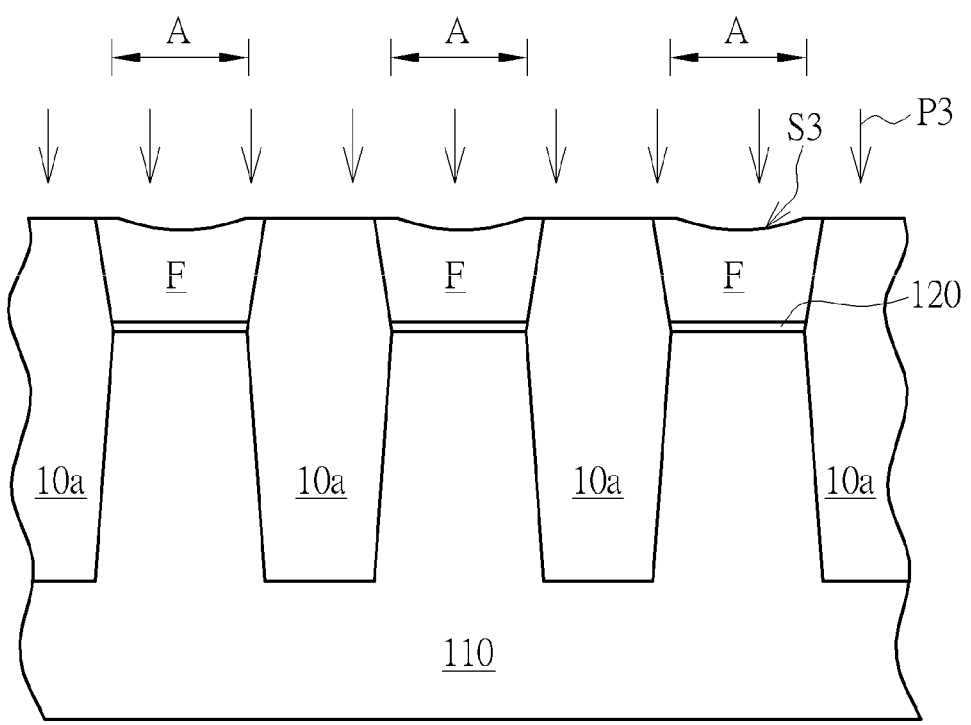

Thereafter, as shown in FIG. 5, a buffer layer 140 is selectively formed on the first conductive material 130. The buffer layer 140 may be an oxide layer, but not limited thereto. Then, an etch back process P3 is performed to etch the buffer layer 140 and the first conductive material 130 to respectively form a plurality of floating gates F between the isolation structures 10a. Therefore, the floating gates F are in the active areas A respectively and separated from each other, as shown in FIG. 6. In this embodiment, the buffer layer 140 is used to form floating gates F having flatter top surfaces S3 than the floating gates being formed through etching the first conductive material 130 only without forming the buffer layer 140 thereon. Thus, the etch back process P3 may have an etching selectivity to the buffer layer 140 and the first conductive material 130, so as to help forming the floating gates F having flat top surfaces S3. Preferably, the etch back process P3 may have high selectivity to the buffer layer 140 and the first conductive material 130 so as to form the floating gates F having flat top surfaces S3. For example, the etching selectivity of the etch back process P3 to the buffer layer 140 and the first conductive material 130 may be at a range of 3~25, but it is not limited thereto. Generally, the top surfaces S3 of the floating gates F are preferably flat for later formed layers thereon to be formed more easily, so that a formed semiconductor structure such as a flash memory can have better performances. In another embodiment, the top surfaces of the floating gates F having a desired curvature to control the processing windows of the floating gates can be obtained by controlling the etching selectivity of the etch back process P3 to the buffer layer 140 and the first conductive material 130.

It is emphasized that, when the etch back process P3 is performed instead of the prior art processes, such as performing a chemical mechanical polishing process, the loading effect caused by the prior art processes can be avoided. Therefore, the floating gates F having flat top surfaces S3 can be formed, the uniformity of the floating gates F can be enhanced, the processing costs for forming the floating gates F can be reduced and the unnecessary parts of the first conductive material 130 left in some specific areas can be avoided. When the buffer layer 140 is further used, the processing flexibility can be increased to form a desired structure, which can achieve specific electrical demands.

Moreover, a buffer layer (not shown) may be further deposited after the etch back process P3 is performed, and then the buffer layer is removed to planarize the top surfaces S3 of the floating gates F again. The buffer layer may be an oxide layer, but it is not limited thereto. The buffer layer may be removed by methods such as a wet etch process, and the wet etch process may contain an etchant of diluted hydrofluoric acid, but it is not limited thereto.

Figure 7:
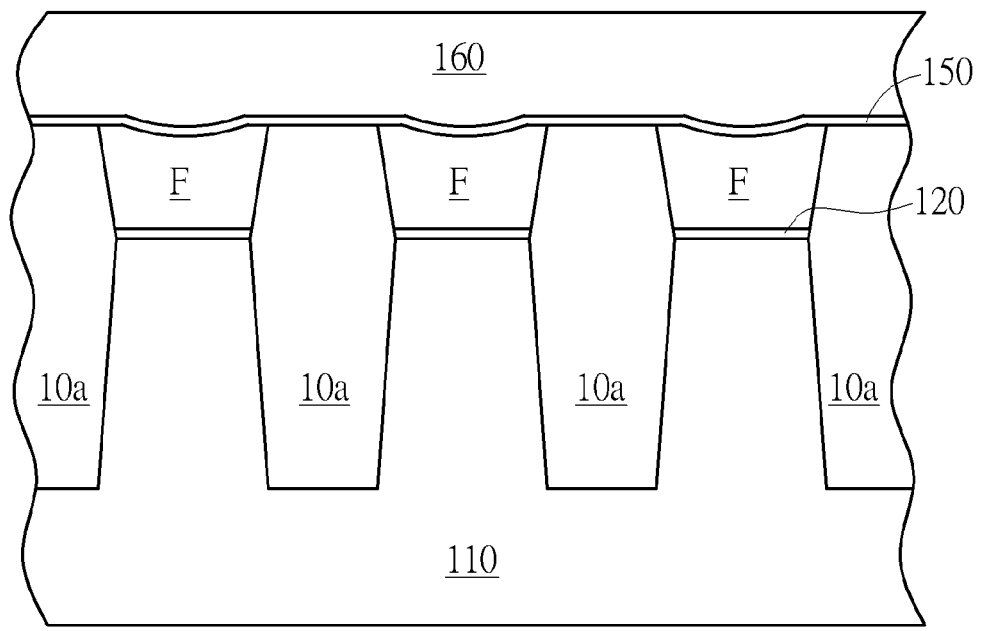

As shown in FIG. 7, a first isolating layer 150 is formed on the floating gates F. In this embodiment, the first isolating layer 150 entirely covers the floating gates F and the isolation structure 10a, wherein the first isolating layer 150 may be an oxide-nitride-oxide (ONO) layer, but it is not limited thereto. Then, a patterned second conductive layer 160 is formed on the first isolating layer 150 to form a control gate. More precisely, the patterned second conductive layer 160 may be formed by entirely covering a second conductive layer on the floating gates F and the isolation structures 10a, and then the second conductive layer is patterned to form the patterned second conductive layer 160. This means that a semiconductor component such as a flash memory may be formed by constituting the floating gates F, the first isolating layer 150 and the patterned second conductive layer 160.

To summarize, the present invention provides a floating gate forming process, which performs an etch back process to etch a first conductive material to form floating gates between isolation structures that are separated from each other. Thus, a loading effect caused by other methods of the prior art, such as chemical mechanical polishing process, can be avoided, which means that floating gates having flat top surfaces can be formed, the uniformity of the floating gates can be enhanced, the processing costs for forming the floating gates can be reduced and the unnecessary parts of the first conductive material left in some specific areas can be avoided. The performances of a semiconductor component such as a flash memory formed with the floating gates of the present invention are therefore enhanced.

Furthermore, when a buffer layer is formed on the first conductive material, and then the buffer layer and the first conductive material are etched until the buffer layer is completely removed and the floating gates are therefore formed, the curvature of the top surfaces of the floating gates can be controlled by selecting the etching selectivity of the etch back process toward the buffer layer and the first conductive material.

Moreover, isolation structures having upper parts with a taper profile broadening from top to bottom can be formed for the first conductive material to be filled more easily between the isolation structures, therefore preventing voids from being generated in the first conductive material. Furthermore, if voids are generated in the first conductive material, a pre-etch back process may be performed before the etch back process is performed to expose the voids, and then recovering the first conductive material, so that a first conductive material without voids can be formed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A floating gate forming process, comprising:
   providing a substrate containing active areas isolated from each other by isolation structures protruding from the substrate;
   forming a first conductive material conformally covering the active areas and the isolation structures;
   forming a buffer layer on the first conductive material;
   performing an etch back process on the buffer layer and the first conductive material to respectively form floating gates separated from each other in the active areas.

2. The floating gate forming process according to claim 1, further comprising:
   forming a first isolating layer on the floating gates; and
   forming a patterned second conductive layer on the first isolating layer to form a control gate.

3. The floating gate forming process according to claim 1, wherein each of the isolation structures has an upper part protruding from the substrate and the upper part has a taper cross-sectional profile broadening from top to bottom.

4. The floating gate forming process according to claim 1, further comprising:
   performing a shaping process to shape the isolation structures before the first conductive material is formed.

5. The floating gate forming process according to claim 1, wherein the isolation structures comprise shallow trench isolation (STI) structures.

6. The floating gate forming process according to claim 2, wherein the first isolating layer comprises an oxide-nitride-oxide (ONO) layer.

7. The floating gate forming process according to claim 1, further comprising:
   forming a second isolating layer on the substrate before the first conductive material is formed.

8. The floating gate forming process according to claim 7, wherein the second isolating layer comprises an oxide layer.

9. The floating gate forming process according to claim 1, wherein the buffer layer comprises an oxide layer.

10. The floating gate forming process according to claim 1, wherein the isolation structures protrude from the substrate with a thickness in a range of 400~800 Angstroms.

11. The floating gate forming process according to claim 1, wherein the first conductive material is formed until a thickness of the conductive material layer protruding from the isolation structure is larger than 500 Angstroms.

* * * * *